United States Patent
Kluth

(10) Patent No.: US 6,521,515 B1
(45) Date of Patent: Feb. 18, 2003

(54) DEEPLY DOPED SOURCE/DRAINS FOR REDUCTION OF SILICIDE/SILICON INTERFACE ROUGHNESS

(75) Inventor: George Jonathan Kluth, Sunnyvale, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 20 days.

(21) Appl. No.: 09/662,820

(22) Filed: Sep. 15, 2000

(51) Int. Cl.[7] .......................... H01L 21/20; H01L 21/36
(52) U.S. Cl. .................. 438/486; 438/296; 438/311; 438/228; 438/257; 438/514; 438/517
(58) Field of Search .................. 438/486, 296, 438/311, 228, 257, 163, 151, 288, 41, 664, 514, 517

(56) References Cited

U.S. PATENT DOCUMENTS

| | | | |
|---|---|---|---|
| 4,214,359 A | * 7/1980 | Kahng | ................... 29/571 |
| 5,693,547 A | * 12/1997 | Gardner et al. | |
| 5,863,829 A | 1/1999 | Nakayoshi et al. | |
| 5,907,789 A | * 5/1999 | Komatsu | ................... 438/649 |
| 5,920,094 A | 7/1999 | Nam | |
| 5,937,315 A | 8/1999 | Xiang et al. | |
| 5,972,762 A | 10/1999 | Wu | |
| 6,010,954 A | 1/2000 | Ho et al. | |
| 6,071,782 A | 6/2000 | Maa et al. | |
| 6,072,217 A | 6/2000 | Burr | |
| 6,313,041 B1 | * 11/2001 | Sakaguchi et al. | .......... 257/347 |
| 6,403,454 B1 | * 6/2002 | Citrin et al. | ................ 438/510 |

* cited by examiner

Primary Examiner—Matthew Smith
Assistant Examiner—V. Yevsikov

(57) ABSTRACT

Metal silicides form low resistance contacts on semiconductor devices such as transistors. Rough interfaces are formed between metal silicide contacts, such as NiSi and the source/drain regions of a transistor, such as doped source/drain regions. Interfaces with a high degree of roughness result in increased spiking and junction leakage. Interface roughness is minimized by deeply doping the source/drain regions of a silicon on insulator substrate.

14 Claims, 4 Drawing Sheets

DEEPLY DOPED SOURCE/DRAINS FOR REDUCTION OF SILICIDE/SILICON INTERFACE ROUGHNESS

TECHNICAL FIELD

The present invention relates to the field of manufacturing semiconductor devices and, more particularly, to an improved salicide process of forming metal silicide contacts.

BACKGROUND OF THE INVENTION

An important aim of ongoing research in the semiconductor industry is the reduction in the dimensions of the devices used in integrated circuits. Planar transistors, such as metal oxide semiconductor (MOS) transistors, are particularly suited for use in high-density integrated circuits. As the size of the MOS transistors and other active devices decreases, the dimensions of the source/drain regions and gate electrodes, and the channel region of each device, decrease correspondingly.

The design of ever-smaller planar transistors with short channel lengths makes it necessary to provide very shallow source/drain junctions. Shallow junctions are necessary to avoid lateral diffusion of implanted dopants into the channel, since such a diffusion disadvantageously contributes to leakage currents and poor breakdown performance. Shallow source/drain junctions, for example on the order of 1.000 Å or less thick are generally required for acceptable performance in short channel devices.

Metal silicide contacts are typically used to provide low resistance contacts to source/drain regions and gate electrodes. The metal silicide contacts are conventionally formed by depositing a conductive metal, such as titanium, cobalt, tungsten, or nickel, on the source/drain regions and gate electrodes by physical vapor deposition (PVD), e.g. sputtering or evaporation; or by a chemical vapor deposition (CVD) technique. Subsequently, heating is performed to react the metal with underlying silicon to form a metal silicide layer on the source/drain regions and gate electrodes. The metal silicide has a substantially lower sheet resistance than the silicon to which it is bonded. Selective etching is then conducted to remove unreacted metal from the non-silicided areas, such as the dielectric sidewall spacers. Thus, the silicide regions are aligned only on the electrically conductive areas. This self-aligned silicide process is generally referred to as the "salicide" process.

A portion of a typical semiconductor device 40 is schematically illustrated in FIG. 1A and comprises a silicon-containing substrate 4 with source/drain 30 regions formed therein. Gate oxide 10 and gate electrode 12 are formed on the silicon-containing substrate 4. Sidewall spacers 14 are formed on opposing side surfaces 13 of gate electrode 12. Sidewall spacers 14 typically comprise silicon based insulators, such as silicon nitride, silicon oxide, or silicon carbide. The sidewall spacers 14 mask the side surfaces 13 of the gate 12 w hen metal layer 22 is deposited, thereby preventing silicide from forming on the gate electrode side surfaces 13.

After metal layer 22 is deposited. heating is conducted at a temperature sufficient to react the metal with underlying silicon in the gate electrode 12 and substrate surface 5 to form conductive metal silicide contacts 24 (FIG. 1B). After the metal silicide contacts 24 are formed, the unreacted metal 22 is removed by etching, as with a wet etchant, e.g., an aqueous $H_2O_2/NH_4OH$ solution. The sidewall spacer 14, therefore, functions as an electrical insulator separating the silicide contact 24 on the gate electrode 12 from the metal silicide contacts 24 on the source/drain regions 30, as shown in FIG. 1B.

Various metals react with Si to form a silicide, however, titanium (Ti) and cobalt (Co) are currently the most common metals used to create silicides ($TiSi_2$, $CoSi_2$) when manufacturing semiconductor devices utilizing salicide technology.

Use of a $TiSi_2$ layer imposes limitations on the manufacture of semiconductor devices. A significant limitation is that the sheet resistance for lines narrower than 0.35 micrometers is high, i.e., as $TiSi_2$ is formed in a narrower and narrower line, the resistance increases. Another significant limitation is that $TiSi_2$ initially forms a high resistivity phase (C49), and transformation from C49 to a low resistivity phase (C54) is nucleation limited, i.e., a high temperature is required to effect the phase change.

Cobalt silicide, unlike $TiSi_2$, exhibits less linewidth dependence of sheet resistance. However, $CoSi_2$ consumes significant amounts of Si during formation, which increases the difficulty of forming shallow junctions. Large Si consumption is also a concern where the amount of Si present is limited, for example, with silicon on insulator (SOI) substrates. Without enough Si to react with Co to form $CoSi_2$, a thin layer of $CoSi_2$ results. The thickness of the silicide layer is an important parameter because a thin silicide layer is more resistive than a thicker silicide layer of the same material, thus a thicker silicide layer increases semiconductor device speed, while a thin silicide layer reduces device speed.

Recently, attention has turned towards using nickel to form NiSi utilizing salicide technology. Using NiSi is advantageous over using $TiSi_2$ and $CoSi_2$ because many limitations associated with $TiSi_2$ and $CoSi_2$ are avoided. When forming NiSi, a low resistivity phase is the first phase to form, and does so at a relatively low temperature. Additionally, nickel (Ni), like Co, diffuses through the film into Si, unlike Ti where the Si diffuses into the metal layer. Diffusion of Ni and Co through the film into Si prevents bridging between the silicide layer on the gate electrode and the silicide layer over the source/drain regions. The reaction that forms NiSi requires less Si than when $TiSi_2$ and $CoSi_2$ are formed. Nickel silicide exhibits almost no linewidth dependence of sheet resistance. Nickel silicide is normally annealed in a one step process, versus a process requiring an anneal, an etch, and a second anneal, as is normal for $TiSi_2$ and $CoSi_2$. Nickel silicide also exhibits low film stress, i.e., causes less wafer distortion.

Although the use of NiSi in salicide technology has certain advantages over utilizing $TiSi_2$ and $CoSi_2$, there are problems using NiSi in certain situations. Forming NiSi on doped, crystallized Si usually produces a smooth interface between the NiSi layer and the doped, crystallized Si layer. However, when crystallized Si is doped with arsenic (As), a rough interface between the NiSi and the doped, crystallized Si forms, which leads to certain problems.

FIG. 2 illustrates the degree of interface 36 roughness between a conventional nickel silicide (NiSi) contact 24 and arsenic doped source/drain region 30. In this system, the mean peak to valley interface roughness height d is about 300 Å to about 400 Å. This large degree of interface roughness can cause a variety of electrical problems such as spiking and increased junction leakage. The interface roughness could penetrate all the way through the source/drain region in a shallow junction device, causing a local short circuit, thereby resulting in junction leakage. In order to prevent these problems, a thinner metal layer can be deposited, thereby resulting in a thinner silicide layer, or the depth of source/drain junction can be increased. However, neither of these approaches is satisfactory: the former approach would result in higher sheet resistance and a slower semiconductor device, and the latter approach runs counter to the trend toward smaller device dimensions, both vertically, and laterally, in order to increase switching speeds.

Interface roughness becomes more pronounced as the concentration of the dopant increases. In an As doped device with NiSi contacts, interface roughness is especially a problem where the peak concentration of the doped arsenic is in the vicinity of the upper surface of the source/drain regions. In a typical arsenic doped MOS device the arsenic ions will be implanted with an energy and dose of 10 to 20 keV and $1 \times 10^{15}$ to $6 \times 10^{15}$ ions/cm$^2$, which results in a peak arsenic concentration at about 200 Å to about 400 Å below the upper surface of the source/drain region. When the peak arsenic concentration is located in this region an unacceptably high degree of interface roughness results when nickel silicide is formed.

Implanting the arsenic ions deeper into the silicon substrate reduces the interface roughness. However, this has been avoided in conventional practice. A Gaussian type distribution of dopant concentration versus implant into depth is obtained when dopants are implanted into bulk silicon substrates. Driving the peak concentration of the dopant deeper into the bulk silicon substrate to overcome the interface roughness effects shifts more of the dopant even deeper into the substrate. In a bulk silicon substrate, deep implantation of dopant to overcome the silicide interface roughness problem results in slower, larger-dimension devices.

The term semiconductor devices, as used herein, is not to be limited to the specifically disclosed embodiments. Semiconductor devices, as used herein, include a wide variety of electronic devices including flip chips, flip chip/package assemblies, transistors, capacitors, microprocessors, random access memories, etc. In general, semiconductor devices refer to any electrical device comprising semiconductors.

SUMMARY OF THE INVENTION

There exists a need in the semiconductor device art to provide silicide contacts for planar transistors which overcome the problem of silicide contact-source/drain region interface roughness. There exists a need in this art to deeply implant dopant in the source/drain regions to prevent silicide interface roughness while maintaining the desirable dimensional and electrical characteristics of shallow implantation. There exists a need in this art to provide arsenic doped source/drain regions with nickel silicide contacts without an unacceptably high degree of silicide-source/drain interface roughness.

These and other needs are met by embodiments of the present invention, which provide a method of manufacturing a semiconductor device comprising providing a silicon-containing substrate having an upper surface. The substrate is doped by ion implantation to form source/drain regions such that the concentration of the dopant and the depth below the upper surface of the implant substantially reduce interface roughness between subsequently formed nickel silicide contacts and the source/drain regions. A nickel layer is deposited over the upper surface of the substrate and the nickel layer is heated so that the nickel layer reacts with the silicon layer to form nickel silicide contacts.

The earlier stated needs are also meet by other embodiments of the instant invention that provide a semiconductor device comprising a silicon-containing substrate having an upper surface. The silicon-containing substrate contains doped source/drain regions and nickel silicide contacts, wherein the doping concentration and depth below the upper surface of the substrate are such that interface roughness between nickel silicide contacts and the source/drain regions is substantially reduced with respect to conventional semiconductor devices comprising nickel silicide contacts.

The earlier stated needs are further met by other embodiments of the instant invention that provide a method of manufacturing a semiconductor device comprising providing a silicon on insulator substrate comprising an insulating layer on a substrate base and a silicon layer is on the insulating layer. A gate oxide layer and conductive gate material are, in turn, formed over the silicon layer. The gate material layer and gate oxide layer are then patterned to form a gate electrode having an upper surface and opposing side surfaces. An insulating material is deposited over the gate electrode and silicon layer. The insulating material is patterned to form sidewall spacers on the opposing sides of the gate electrode. Source/drain implants are formed by ion implanting a dopant into the silicon layer, such that the dopant concentration and depth significantly reduces the interface roughness between subsequently formed nickel silicide contacts and source/drain regions. The source/drain implants are subsequently heated to activate the source/drain regions and then a nickel layer is deposited over the gate electrode and source/drain regions. The nickel layer is heated so that the nickel reacts to form nickel silicide contacts with the underlying silicon on the gate electrode and source/drain regions. The unreacted portions of the nickel layer are removed from the device.

This invention addresses the needs for an improved method of forming high conductivity silicide contacts to source/drain regions and gate electrodes with reduced silicide interface roughness and improved electrical characteristics. The present invention reduces the possibility of spiking and junction leakage.

The foregoing and other features, aspects, and advantages of the present invention will become apparent in the following detailed description of the present invention when taken in conjunction with the accompanying drawings.

DETAILED DESCRIPTION OF THE INVENTION

Figure 1A:
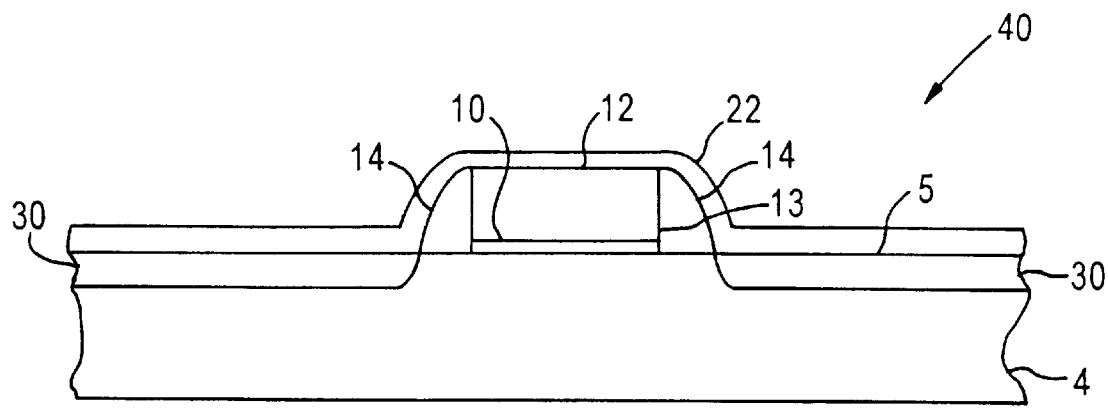
FIGS. 1A and 1B schematically illustrate a prior art semiconductor device before and after forming silicide contacts.
Figure 1B:
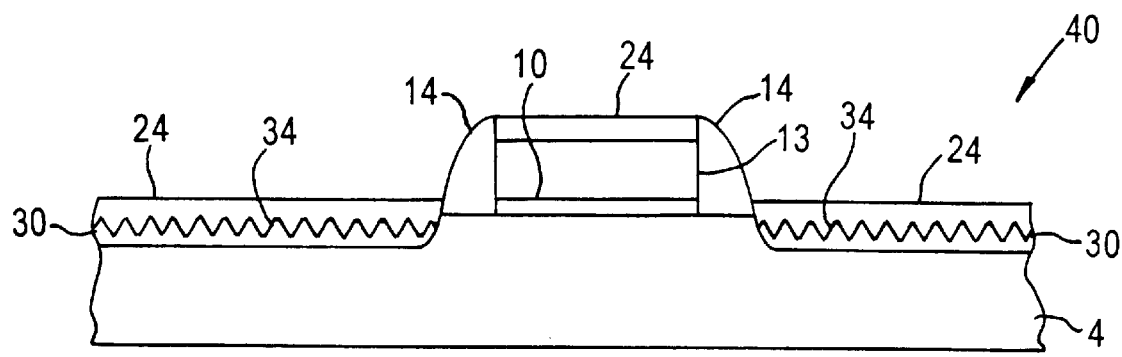

The present invention enables the production of semiconductor devices with improved performance and reduced failure rates by reducing source/drain junction interface roughness. The present invention provides semiconductor devices with reduced spiking and junction leakage. The present invention provides an improved semiconductor device with nickel silicide contacts. These are achieved by forming source/drain implants by ion implantation into the substrate at a predetermined concentration and depth.

The invention will be described in conjunction with the formation of the semiconductor device in the accompanying drawings. However, this is exemplary only as the claimed invention is not limited to the formation of and the specific device illustrated in the drawings.

Figure 3G:
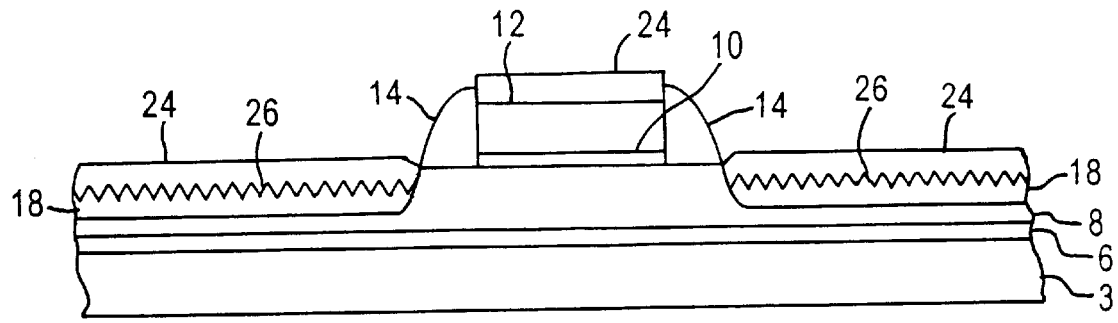
FIGS. 3A–3G schematically illustrate the formation of metal silicide contacts for semiconductor devices according to an embodiment of the present invention.
Figure 2:
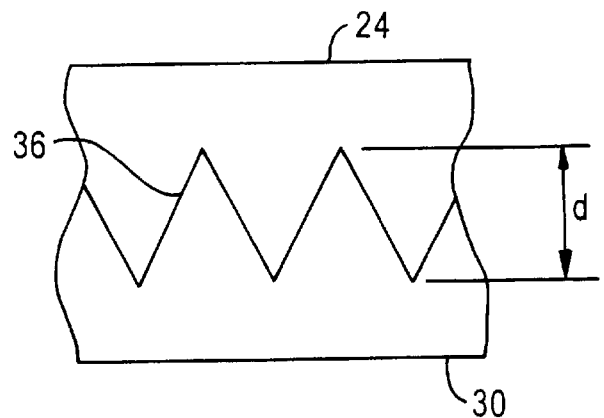
FIG. 2 is a detailed view of a silicide-source/drain region interface of the prior art.
Figure 3A:
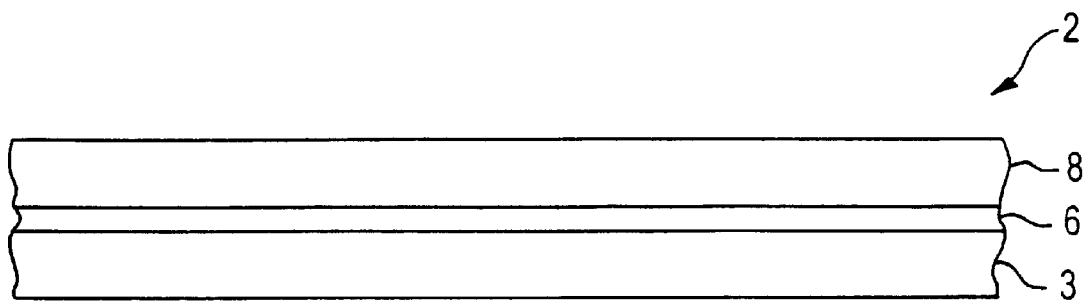
Figure 3B:
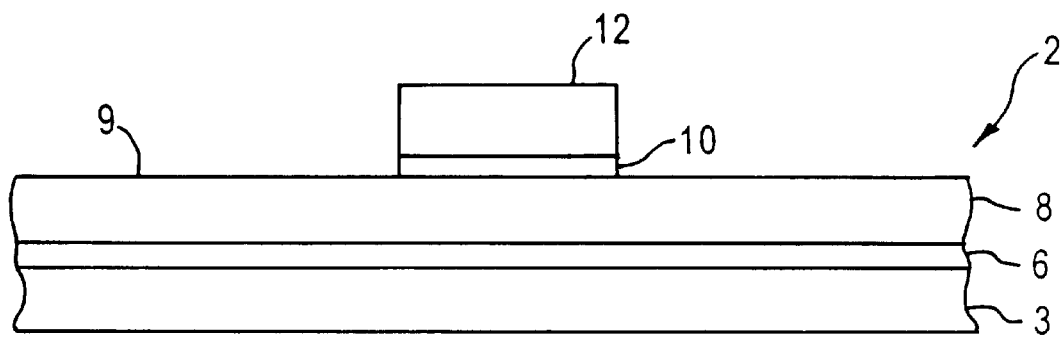
Figure 3C:
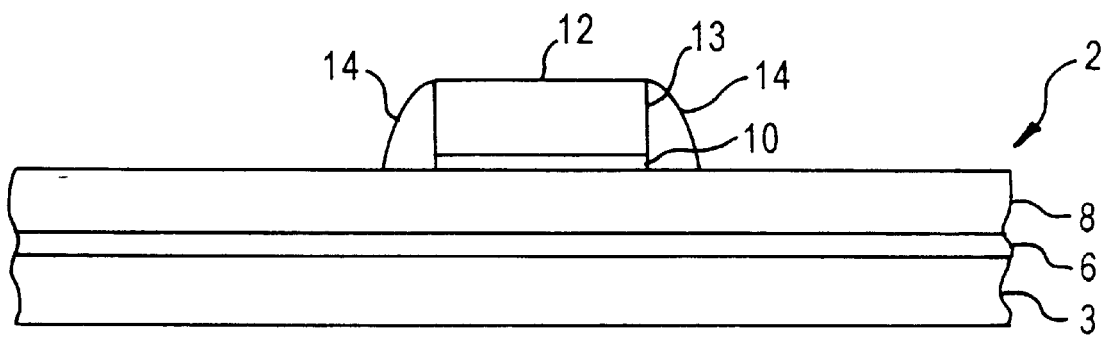

A silicon on insulator (SOI) substrate 2 is illustrated in FIG. 3A. The SOI substrate 2 comprises a semiconductor substrate base layer 3 with an insulating layer 6 on the base layer 3 and a silicon layer 8 on the insulating layer 6. The substrate base layer 3 comprises a conventional semiconductor substrate, such as a silicon wafer. The insulating layer 6 comprises a conventional insulating material such as silicon dioxide or silicon nitride. The thickness of silicon layer 8 is about 500 Å to about 2,000 Å. A gate oxide layer 10 and a conductive gate material layer 12. such as polysilicon, are formed on the silicon layer upper surface 9. The gate oxide 10 and gate electrode 12 layers are patterned by conventional photolithographic techniques to form gate electrode 12 and the underlying gate oxide layer 10, as shown in FIG. 3B. An insulating layer, such as silicon dioxide, silicon nitride, or silicon carbide, is deposited over the substrate 2 and patterned using an anisotropic etch to form sidewall spacers 14 on the opposing sides 13 of the gate electrode 12, as shown in FIG. 3C.

Figure 3D:
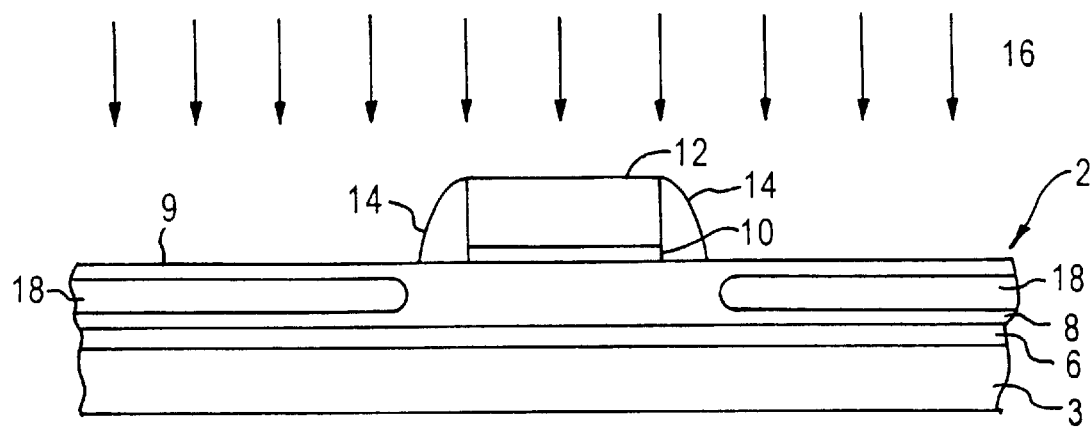

Using the gate electrode 12 and sidewall spacers 14 as masks, dopant 16 is introduced into the silicon layer 8, as shown in FIG. 3D, forming source/drain regions 18. Conventional dopants. such as antimony, arsenic, phosphorous, or boron can be introduced into the source/drain regions 18. The dopant can be introduced by ion implantation. The dopant ions are implanted to a predetermined depth belong the upper surface 9 of the silicon layer 8.

To minimize silicide-source/drain region interface roughness, the ions are implanted to a predetermined depth so that the concentration of dopant ions is greatest at a depth of about 450 Å to about 700 Å below the substrate upper surface 9. In order to implant the ions at this depth, the tons are implanted with an energy of about 15 keV to about 40 keV, at a dose of about $1\times10^{15}$ to about $6\times10^{15}$ ions/cm$^2$. When arsenic is implanted into the source/drain regions, a suitable peak arsenic concentration is about $1\times10^{20}$ ions/cm$^3$ to about $4\times10^{20}$ ions/cm$^3$. After ion implantation, the source/drain regions are activated by a first rapid thermal anneal at a temperature greater than 1000° C. for about 5 to about 30 seconds.

By comparison, in the prior art method of FIG. 1A, the source/drain regions 30 are formed in a bulk silicon substrate 4. The ions implanted in the source/drain regions 30 are near the upper surface 5 of the bulk silicon substrate 4.

Figure 3E:
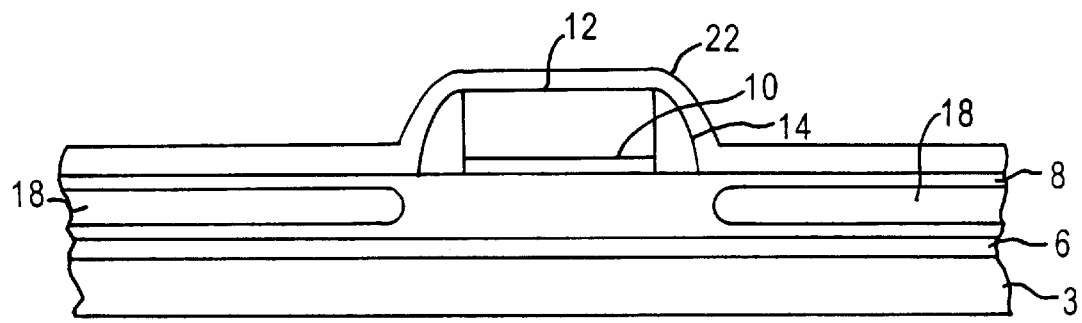

Referring to FIG. 3E, after the first rapid thermal anneal, a metal layer 22 is deposited over the source/drain region 18 and the gate electrode 12. Metal layers are deposited by a PVD method such as sputtering or evaporation, or a CVD method. The metal is deposited to a layer thickness of about 100 Å to about 500 Å. The metal layer 22 can comprise Co, Ni, Ti, Mo, Ta, W, Cr, Pt, or Pd. Because it forms silicide by a low temperature, single step anneal, among the other reasons herein described, nickel is a preferred metal.

Figure 3F:
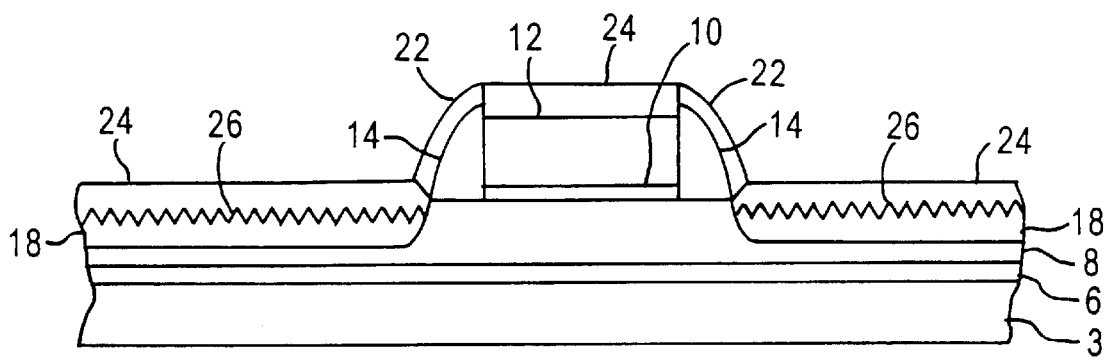

The deposited nickel layer 22 is subsequently annealed in a second rapid thermal anneal step to form the metal silicide contacts 24, as depicted in FIG. 3F. The nickel layer 22 is annealed for about 15 to about 120 seconds at about 350° C. to about 700° C. to form NiSi. If the annealing temperature is below about 350° C. or greater than 700° C. relatively low conductivity Ni$_2$Si or NiSi$_2$ are respectively formed.

Figure 4:
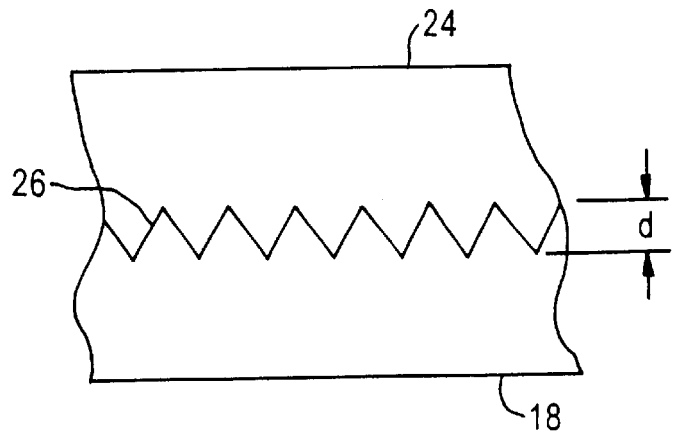
FIG. 4 is a detailed view of a silicide-source/drain region interface formed according to the present invention.

Silicide contacts 24 are formed on the gate electrode 12 and source and drain regions 18 as shown in FIG. 3F. As shown in FIG. 3G and FIG. 4, interface 26 is formed between silicide contact 24 and source/drain region 18. The silicide-source/drain region interface 36 formed according to the prior art process, FIG. 3, has a larger peak to valley distance d than the peak to valley distance d of the silicide interface 26 formed according to the present invention. The prior art mean peak to valley distance d is about 300 Å to about 400 Å. In embodiments of the present invention the mean peak to valley distance d of the silicide-source/drain interface is reduced to less than 100 Å.

The methods of the present invention provide reduced silicide/silicon interface roughness by deeply doping while maintaining the favorable electrical characteristics of shallow doping. Deeply implanting dopant into a bulk silicon substrate would result in forming source/drain junctions deeper than 1000 Å below the upper surface of the silicon-containing substrate. In certain embodiments of the present invention the source/drain junctions are confined to the silicon layer 8. Oxide layer 6 prevents the source/drain junctions from extending deeper into the substrate.

For example, in one embodiment silicon layer 8 is about 1000 Å thick. Oxide layer 6 prevents the source/drain regions from extending deeper into the substrate. as they would if they were implanted Into a bulk silicon substrate. By confining the source/drain regions to the silicon layer thickness, the present Invention provides greater conductivity in the source/drain junctions and prevents spiking and junction leakage because of interface roughness. The present invention produces silicide contact-source/drain region interfaces with reduced interface roughness and increased conductivity in a novel, elegant manner.

The embodiments illustrated in the instant disclosure are for illustrative purposes only. It should not be construed to limit the scope of the claims. As is clear to one of ordinary skill in the art, the instant disclosure encompasses a wide variety of embodiments not specifically illustrated herein.

What is claimed is:

1. A method of manufacturing a semiconductor device, the method comprising:

providing a silicon-containing substrate having an upper surface;

forming source/drain implants by ion implanting dopant into the substrate at a sufficient concentration and depth below the upper surface of the substrate to substantially reduce interface roughness between subsequently formed nickel silicide contacts and source/drain regions;

depositing a layer of nickel over the upper surface of the substrate; and heating to react the nickel layer with underlying silicon to form the nickel silicide contacts.

2. The method according to claim 1 wherein the dopant is arsenic (As).

3. The method according to claim 2, wherein the silicon-containing insulator is a silicon-on-insulator (SOI) substrate comprising a silicon layer on a base layer with an insulating layer therebetween, and the As dopant is implanted into the silicon layer.

4. The method according to claim 3, wherein the silicon layer has a thickness of about 500 Å to about 2000 Å.

5. The method according to claim 3, comprising ion implanting the As at an implantation dosage of about $1\times10^{15}$ ions/cm² to about 6×10¹⁵ ions/cm² and an implantation energy of about 15 keV to about 40 keV.

6. The method according to claim 3, comprising ion implanting the As to a depth of about 450 Å to about 700 Å below the upper surface of the silicon layer.

7. The method according to claim 3, comprising heating at a temperature of about 350° C. to about 700° C. to form the nickel silicide contacts.

8. The method according to claim 1, wherein the interface between the metal silicide contacts and the source/drain regions has a mean peak to valley roughness of less than about 100 Å.

9. A semiconductor device produced by a method comprising:

> providing a silicon-containing substrate having an upper surface;
>
> forming source/drain implants by ion implanting dopant into the substrate at a sufficient concentration and depth below the upper surface of the substrate to substantially reduce interface roughness between subsequently formed nickel silicide contacts and source/drain regions;
>
> depositing a layer of nickel over the upper surface of the substrate; and
>
> heating to react the nickel layer with underlying silicon to form the nickel silicide contacts.

10. A method of manufacturing a semiconductor device, the method comprising:

> providing a silicon on insulator substrate comprising a silicon layer on a base layer with an insulating layer therebetween;
>
> forming a gate oxide layer on the silicon layer;
>
> depositing a conductive gate material layer on the gate oxide layer;
>
> patterning the gate material layer and gate oxide layer to form a gate electrode, having an upper surface and opposing side surfaces, with a gate oxide layer thereunder;
>
> depositing a layer of an insulating material over the gate electrode and silicon layer;
>
> patterning the insulating material to form sidewall spacers on the opposing side surfaces of the gate electrode;
>
> forming source/drain implants by implanting a dopant into the silicon layer, such that the dopant concentration and depth significantly reduces the interface roughness between subsequently formed nickel silicide contacts and source/drain regions;
>
> heating to activate the source and drain regions;
>
> depositing a layer of nickel over the gate electrode and source/drain regions;
>
> heating to react the nickel layer with underlying silicon to form metal silicide contacts on the gate electrode and on the source/drain regions; and
>
> removing the nickel that did not react to form nickel silicide.

11. The method according to claim 10, wherein the dopant is As.

12. The method according to claim 11, comprising forming the silicon layer at a thickness of about 500 Å to about 2000 Å.

13. The method according to claim 11, comprising ion implanting As to a depth of about 450 Å to about 700 Å.

14. The method according to claim 10, wherein the interface between the nickel silicide contacts and the source/drain regions has a mean peak to valley roughness of less than about 100 Å.

* * * * *